United States Patent
Fatemi et al.

(10) Patent No.: US 7,886,247 B2
(45) Date of Patent: Feb. 8, 2011

(54) METHOD AND APPARATUS FOR STATISTICAL PATH SELECTION FOR AT-SPEED TESTING

(75) Inventors: Hanif Fatemi, San Jose, CA (US); Chandramouli Visweswariah, Croton-on-Hudson, NY (US); Jinjun Xiong, White Plains, NY (US); Vladimir Zolotov, Putnam Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 343 days.

(21) Appl. No.: 12/111,634

(22) Filed: Apr. 29, 2008

(65) Prior Publication Data

US 2009/0271751 A1   Oct. 29, 2009

(51) Int. Cl.
*G06F 17/50* (2006.01)
(52) U.S. Cl. .................... 716/6; 716/4; 716/5; 703/19; 714/741
(58) Field of Classification Search ............... 716/4–6; 703/19; 714/741
See application file for complete search history.

(56) References Cited

U.S. PATENT DOCUMENTS

| | | | | |
|---|---|---|---|---|
| 7,620,921 | B2 * | 11/2009 | Foreman et al. | 716/6 |
| 2005/0065765 | A1 * | 3/2005 | Visweswariah | 703/19 |
| 2007/0288822 | A1 * | 12/2007 | Lin et al. | 714/741 |
| 2008/0183731 | A1 * | 7/2008 | Gilbert | 707/100 |
| 2008/0209292 | A1 * | 8/2008 | Yokota | 714/733 |
| 2008/0270953 | A1 * | 10/2008 | Foreman et al. | 716/4 |
| 2009/0115469 | A1 * | 5/2009 | Cortadella et al. | 327/142 |
| 2009/0119629 | A1 * | 5/2009 | Grise et al. | 716/6 |

OTHER PUBLICATIONS

Jess et al.; "Statistical Timing for Parametric Yield Prediction of Digital Integrated Circuits"; IEEE; vol. 25, No. 11; Nov. 2006; pp. 2376-2392.*

* cited by examiner

*Primary Examiner*—Naum B Levin

(57) ABSTRACT

In one embodiment, the invention is a method and apparatus for statistical path selection for at-speed testing. One embodiment of a method for selecting a path of an integrated circuit chip for at-speed testing includes computing a process coverage metric for a plurality of paths in the integrated circuit chip and selecting at least one path that maximizes the process coverage metric.

25 Claims, 4 Drawing Sheets

US 7,886,247 B2

METHOD AND APPARATUS FOR STATISTICAL PATH SELECTION FOR AT-SPEED TESTING

BACKGROUND OF THE INVENTION

The present invention relates generally to design automation, and relates more particularly to at-speed testing of integrated circuit chips.

When integrated circuit (IC) chips come off the manufacturing line, the chips are tested "at-speed" to ensure that they perform correctly (and to filter out chips that do not perform correctly). In particular, a set of paths is selected, and the set of paths is then tested for each chip in order to identify the chips in which one or more of the selected paths fail timing requirements. Selection of these paths is complicated by the presence of process variations. Because of these variations, different paths can be critical in different chips. That is, a path that is critical in one chip may not be critical in another chip, and vice versa. Some paths do have a higher probability of being critical, but conventional testing methodologies fail to identify the paths that are statistically most likely to fail, taking into account process variations for the entire process space.

Thus, there is a need in the art for a method and apparatus for statistical path selection for at-speed testing.

SUMMARY OF THE INVENTION

In one embodiment, the invention is a method and apparatus for statistical path selection for at-speed testing. One embodiment of a method for selecting a path of an integrated circuit chip for at-speed testing includes computing a process coverage metric for a plurality of paths in the integrated circuit chip and selecting at least one path that maximizes the process coverage metric.

BRIEF DESCRIPTION OF THE DRAWINGS

So that the manner in which the above recited features of the present invention can be understood in detail, a more particular description of the invention may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
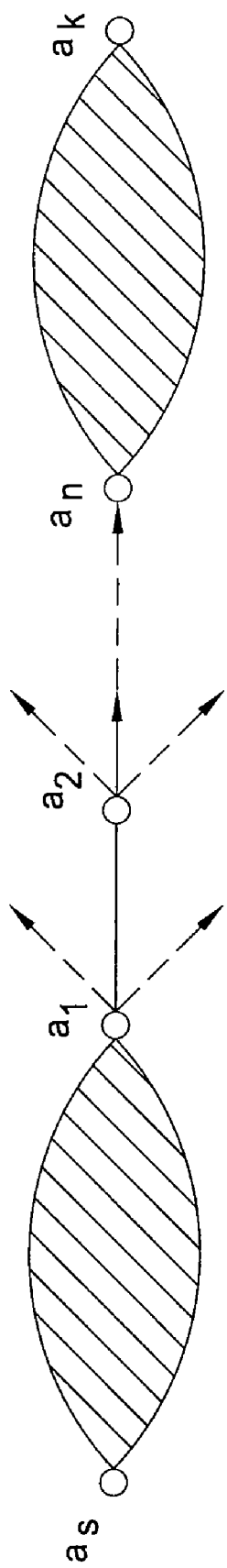
FIG. 1 is a schematic diagram illustrating one embodiment of a method for computing the timing slack of a set of paths going through a common segment.

In one embodiment, the present invention is a method and apparatus for statistical path selection for at-speed testing. Embodiments of the present invention select a minimal set of paths from among the billions of paths in an IC chip, where the minimal set of paths comprises the paths most likely to detect timing defects in the IC chip due to process variations.

Embodiments of the present invention use the results of statistical static timing analysis to compute a metric by which a set of paths can be selected for testing. Within the context of the present invention, the term "node slack" (i.e., the timing slack of a node) refers to how much earlier than required a signal arrives at a node (negative node slack indicates a timing violation). The node slack of a node, i, may be calculated as the required arrival time ($RAT_i$) for the node minus the actual arrive time ($AT_i$) for the node.

For ease of explanation, only late mode or setup timing tests are considered, which detect long paths through the circuit. The detection of short paths, which can cause early mode or hold timing violations, is analogous.

Within the context of the present invention, the term "path slack" (i.e., the timing slack $d_\pi$ of a path $\pi$) refers to how much faster a signal propagates through a path than required (negative path slack implies that the path is too slow and causes a timing violation). The path slack of a path $\pi$ that goes from node a to node b with delay $d_\pi$ may be calculated as the required arrival time at node b minus the delay $d_\pi$ minus arrival time at node a.

If a node i has a node slack s then among all paths $\pi$ going through the node i there is at least one critical path $\pi_{crit}$ whose path slack $s_{crit}$ is equal to the node's node slack s. Moreover, among these paths $\pi$ there is no path $\pi_i$, whose path slack $s_i$ is less than the node's node slack s.

Within the context of the present invention, the term "path set slack" (i.e., the timing slack of a set $\Pi$ of paths $\Pi=\{\pi_1, \pi_2, \ldots\}$) refers to the minimum of the path slacks of the individual paths making up the set of paths. For any set $\Pi$ of paths having a path set slack s there is at least one critical path $\pi_{crit}$ whose path slack $s_{crit}$ is equal to the path set slack s.

Within the context of the present invention, the term "chip slack" refers to the timing slack of all paths in a chip (i.e., the minimum of the path slacks across all paths in the chip). Chip slack is also the minimum of the node slack at all end points in the chip. If the chip slack is negative, then the chip has a timing violation.

In the presence of process variations, arrival times, required arrival times, delays, and all other timing quantities are represented as probability distributions. Thus, node slack is defined as before, but is represented by a probability distribution. Path slack is also defined as before and is represented by a probability distribution. Node slack is the statistical minimum of the path slack of all paths that go through that node. Path set slack is defined as the statistical minimum of the individual path slacks in the set.

As discussed above, embodiments of the present invention define a metric, hereinafter referred to as a "process coverage metric," that guides selection of the representative set of paths. The process coverage metric $Q(\Pi)$ is defined as the probability that a tested chip has no timing violations conditional on a set $\Pi$ of paths passing at-speed testing. In other words:

$$Q(\Pi)=P(\text{Chip is good}|\text{Test passed}) \qquad \text{(EQN. 1)}$$

Thus, maximizing the process coverage metric maximizes the probability that a chip works if all of the selected paths satisfy the timing requirements.

The process coverage metric can be efficiently calculated from statistical timing information for the chip. Let $S_C$ be the statistical chip slack in worst-case field conditions (i.e., worst-case voltage, temperature, and aging). Now consider only the subset of the chip that comprises the paths to be tested. Let $S_T$ be the test slack of this subset of the chip, timed at the conditions experienced in the test chamber. The process coverage metric can thus be expressed in terms of the chip slack and the test slack as:

$$Q(\Pi) = P(S_C \geq 0 | S_\Pi \geq 0) \quad \text{(EQN. 2)}$$

where $S_\Pi$ is the path set slack of the set of tested paths. Accounting for the fact that path set slack is the statistical minimum of the paths' individual path slacks $s_i$, EQN. 2 can be rewritten as:

$$Q(\Pi) = P(S_C \geq 0 | \min(s_i) \geq 0) \quad \text{(EQN. 3)}$$

If block-based statistical timing computed the chip slack, the path slack, and the test slack in a parameterized statistical form (e.g., in linear canonical form), then the process coverage metric can be computed as the conditional probability expressed in EQN. 3.

The process coverage metric increases with the size of the set of tested paths (i.e., the greater the number of paths tested, the greater the process coverage metric). In one embodiment, the number of paths tested is capped at a threshold number of paths, or a threshold process coverage metric value (i.e., enough paths are tested to achieve a desired process coverage metric). In another embodiment, the number of paths tested is as many paths as can be tested in the time given to test.

In one embodiment, depth-first path traversal combined with a branch-and-bound algorithm is used to select the paths with the highest process coverage metric. Branch-and-bound relies heavily on the quality of the bounds for efficiency. In one embodiment, the bounds are tight and easy to compute. EQN. 2 can thus be rewritten as:

$$Q(\Pi) = P(S_C \geq 0 | S_\Pi \geq 0) = \frac{P(S_C \geq 0 \ \& \ S_\Pi \geq 0)}{P(S_\Pi \geq 0)} \quad \text{(EQN. 4)}$$

Where $S_C$ represents all paths of the chip and is therefore always less than the path set slack of any set $\Pi$ of paths. Thus, if the chip slack $S_C \geq 0$ it implies that $S_\Pi \geq 0$. EQN. 4 can thus be simplified as:

$$Q(\Pi) = \frac{P(S_C \geq 0)}{P(S_\Pi \geq 0)} \quad \text{(EQN. 5)}$$

The chip slack $S_C$ does not depend on the paths selected for testing. Therefore, a simpler surrogate metric can be used:

$$q(\Pi) = P(S_\Pi \geq 0) \quad \text{(EQN. 6)}$$

which is minimized in order to maximize the process coverage metric. This surrogate metric is referred to as the "inverse process coverage metric," and the smaller the inverse process coverage metric is for a path, the more valuable the path is for at-speed testing.

FIG. 1 is a schematic diagram illustrating one embodiment of a method for computing the timing path set slack of a set of paths going through a common segment. The path set slack of the set $\Pi$ of all paths going through the path segment $Z_{1,n} = (a_1, a_2, \ldots, a_n)$ is given by:

$$S_\Pi = RAT(a_n) - AT(a_1) - D(Z_{1,n}) \quad \text{(EQN. 7)}$$

where $RAT(a_n)$ is the required arrival time at node $a_n$, $AT(a_1)$ is the arrival time at node $a_1$, and $D(Z_{1,n})$ is the delay of the path segment $Z_{1,n}$.

In deterministic static timing, the path slack $s_i$ of any path $\pi_i$ from the set $\Pi$ of paths ($\Pi = \{\pi_1, \pi_2, \ldots\}$) is not worse (i.e., is not smaller) than the path set slack $S_\Pi$ of the set of paths. The analogous inequality in the case of statistical static timing thus follows:

$$q(\pi_i) = P(s_i \geq 0) \geq P(S_\Pi \geq 0) \quad \text{(EQN. 8)}$$

The inequality of EQN. 8, together with EQN. 7, gives a means to quickly check if the best candidate path going through a path segment is better than a previously identified path. For example, as discussed in further detail below with respect to FIG. 2, EQNs. 7 and 8 can be used to determine whether a newly examined path is better (i.e., has a lower inverse process coverage metric) than a previously identified best path.

Figure 2:
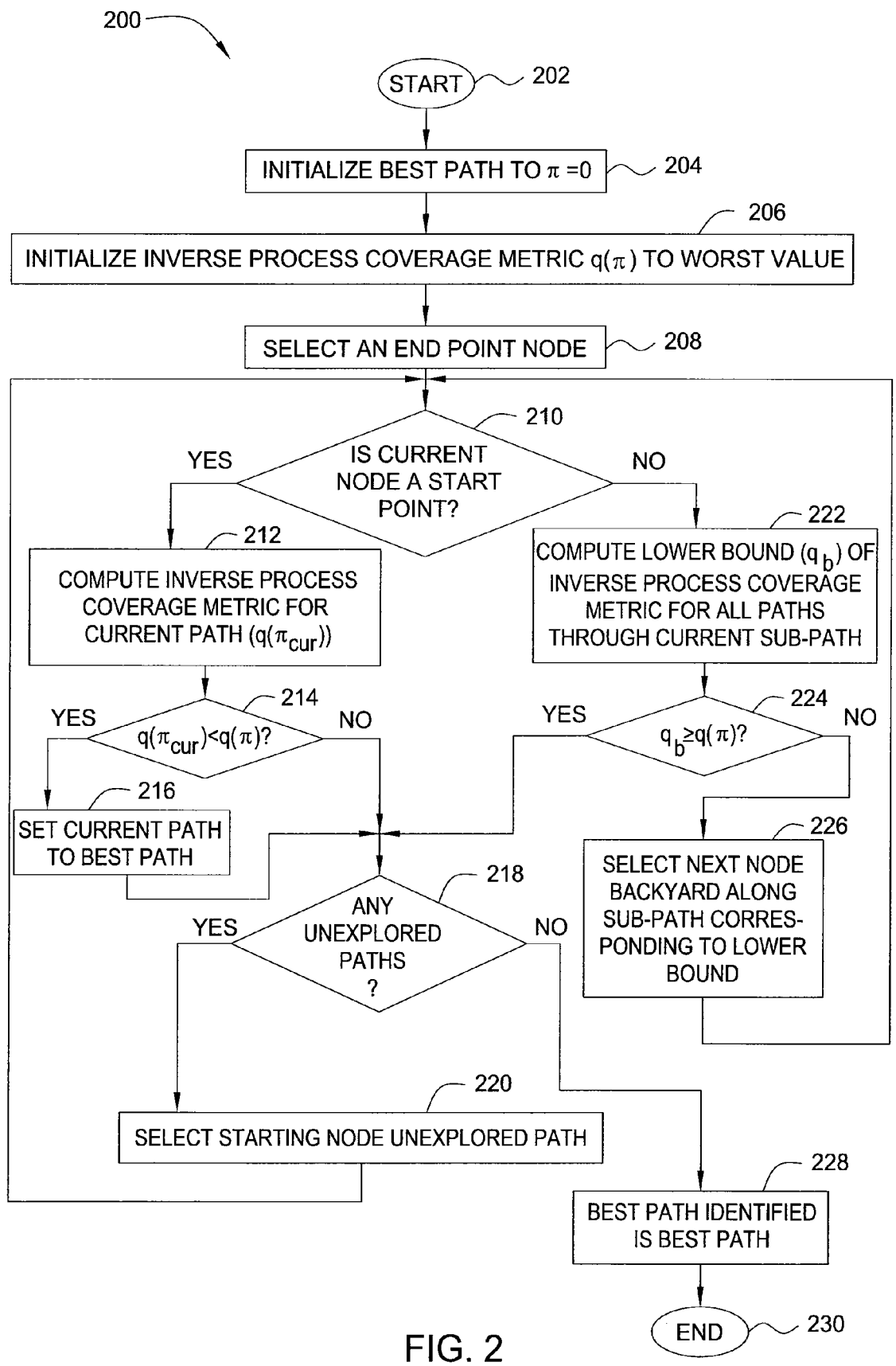
FIG. 2 is a flow diagram illustrating one embodiment of a method for statistical path selection, according to the present invention.

FIG. 2 is a flow diagram illustrating one embodiment of a method 200 for statistical path selection, according to the present invention. The method 200 is based on a branch and bound-type algorithm that selects a path with a minimum value of the inverse process coverage metric. Specifically, the method 200 constructs paths starting from end points and tracing backward to start points. Operation of the method 200 can be considered from two points of view: (1) traversal of a timing graph; and (2) traversal of a decision tree (i.e., a representation of a depth first traversal of the timing graph corresponding to a given chip). In the latter case, each node of the decision tree represents a unique path from an end point to the node. The leaves of the tree represent paths between end points and start points. Thus, at each node of the tree, the method 200 makes a decision to either continue or not continue backward expansion of the path through that node; accordingly, the method 200 traverses only a small portion of the entire tree.

The method 200 is initialized at step 202 and proceeds to step 204, where the method 200 initializes the best path as $\pi = \phi$ (i.e., the empty set). The method 200 then proceeds to step 206 and initializes the process coverage metric $q(\pi)$ of the best path as equal to the worst possible inverse process coverage metric value (e.g., one).

Having initialized these parameters, the method 200 proceeds to step 208 and selects an end point $a_j$ of the timing graph. In selecting the end point $a_j$ the method 200 initializes the following additional parameters: (1) the selected end point $a_j$ is initialized as the current node $a_{cur}$ of the timing graph from which to continue backward traversal; and (2) the selected end point $a_j$ is also initialized as the current sub-path of the timing graph that is being traversed $\pi_{cur}$ (i.e., at this point, the sub-path $\pi_{cur}$ has only one node—end point $a_j$).

The method 200 then proceeds to step 210 and determines whether the current node $a_{cur}$ is a start point in the timing graph. If method 200 concludes in step 210 that the current node is a start point, the method 200 proceeds to step 212 and computes the inverse process coverage metric $q(\pi_{cur})$ of the current candidate path $\pi_{cur}$ (where the current candidate path spans the path between the end point $a_j$ and the current node $a_{cur}$).

The method 200 then proceeds to step 214 and determines whether the inverse process coverage metric $q(\pi_{cur})$ of the current candidate path $\pi_{cur}$ is less (better) than the inverse process coverage metric $q(\pi)$ of the current best path $\pi$. If the method 200 concludes in step 214 that $q(\pi_{cur}) < q(\pi)$ the method 200 proceeds to step 216 and sets the current path $\pi_{cur}$ as the best path $\pi$. The method also sets the inverse process coverage metric $q(\pi_{cur})$ of the current path as the inverse process coverage metric $q(\pi)$ of the best path.

The method 200 then proceeds to step 218 and determines whether any paths remain to be explored in a standard depth-first traversal order. If the method 200 concludes in step 218 that there is at least one unexplored path remaining, the method 200 proceeds to step 220 and selects the starting node from which to work backwards to examine the next unexplored path. Having selected the node, the method 200 returns to step 210 and proceeds as described above.

Referring back to step 210, if the method 200 concludes that the current node $a_{cur}$ is not a start point, the method 200 proceeds to step 222 and computes the lower bound $q_b$ of the process coverage metric for the paths going through the currently traversed sub-path $\pi_{cur}$. That is, the method 200 computes the process coverage metric for each possible direction that the currently traversed sub-path $\pi_{cur}$ may take through the current node $a_{cur}$ and identifies the direction with the lowest inverse process coverage metric. In one embodiment, the lower bound $q_b$ is computed in accordance with EQNs. 7 and 8, discussed above.

In step 224, the method 200 determines whether the lower bound $q_b$ of the inverse process coverage metric for the paths going through the currently traversed sub-path $\pi_{cur}$ is greater than or equal to than the inverse process coverage metric $q(\pi)$ of the best path. If the method 200 concludes in step 224 that $q_b \geq q(\pi)$, the method 200 advances to step 218 and proceeds as described above to determine whether any paths remain to be explored (i.e., the current direction of query is fruitless).

Alternatively, if the method 200 concludes in step 224 that $q_b < q(\pi)$, the method 200 proceeds to step 226 and selects the next node $a_{cur+1,j}$ working backward from the current node $a_{cur}$ along the sub-path corresponding to the lower bound, $q_b$. The best path found remains as $\pi$ and the process coverage metric for the best path remains as $q(\pi)$. The method 200 resets the current node $a_{cur}$ to $a_{cur+1,j}$ to continue traversal from the newly selected node. The method 200 also resets the sub-path being traversed $\pi_{cur}$, as $(a_{cur+1,j}, \pi_{cur})$. Having selected the node, the method 200 returns to step 210 and proceeds as described above.

Figure 3:
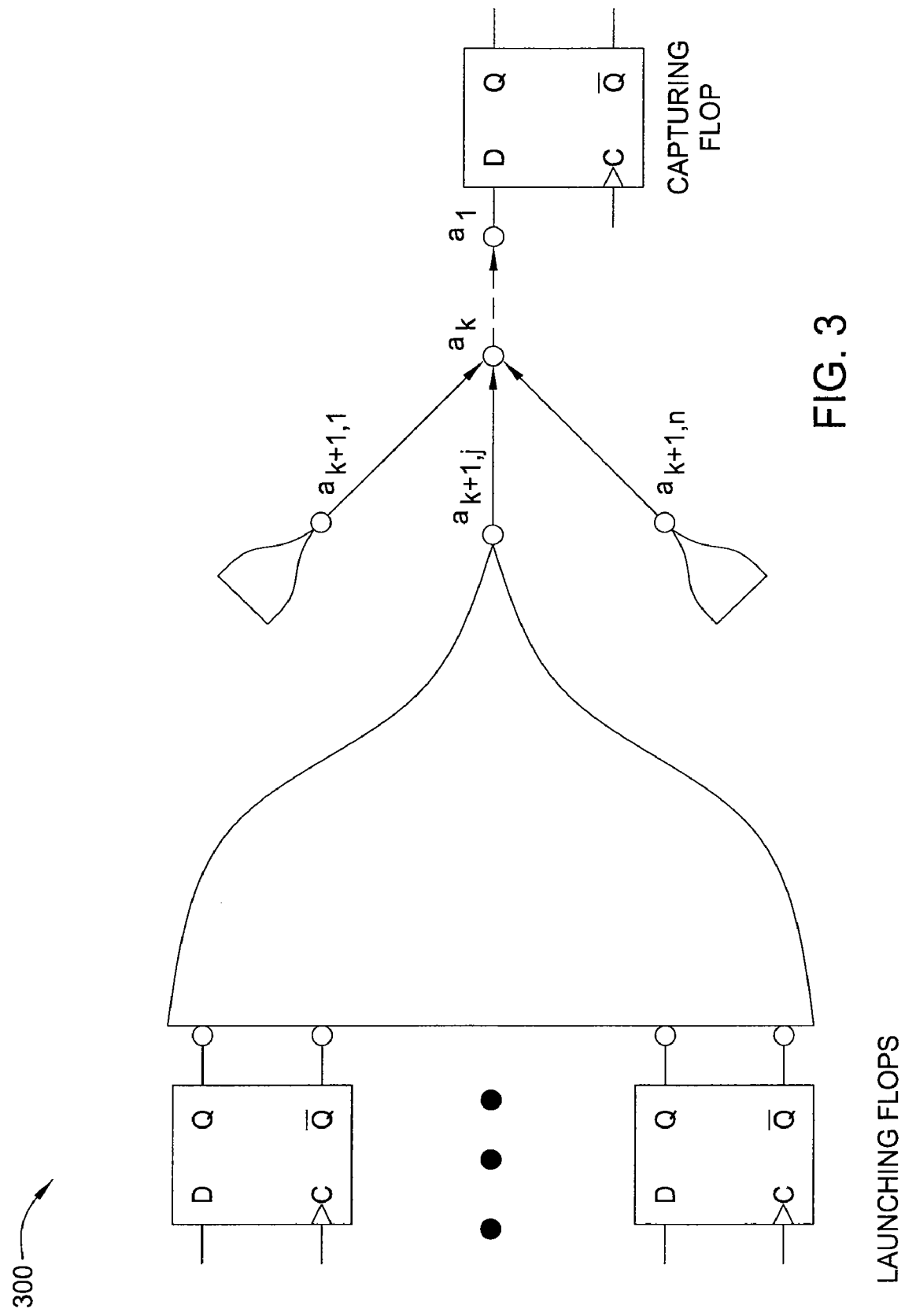
FIG. 3 is a schematic diagram illustrating the sub-graph for path traversal that the method illustrated in FIG. 2 considers at each iteration.

The method 200 thus iterates through all of the end points of the timing graph, performing a backward traversal. FIG. 3 is a schematic diagram illustrating the sub-graph 300 for path traversal that the method 200 considers at each iteration. As illustrated, the path $a_k, a_{k-1}, \ldots, a_1$ is already traversed by the method 200. At node $a_k$, the method 300 will consider the paths that continue through nodes $a_{k+1,1}, a_{k+1,j}$, and $a_{k+1,n}$.

The method 200 illustrates a basic method that selects a single path having the best value of the process coverage metric. However, for testing purposes, it is typically necessary to select a plurality of paths to ensure good detection of process variation delay faults. In one embodiment, this is accomplished through multiple applications of the method 200. Because this approach requires multiple traversals of the same timing graph, though, this is not the optimal solution.

In further embodiments, modifications are made to the method 200 so that the plurality of paths can be selected through a single traversal of the timing graph. For example, assume that the goal is to select the N best paths with the best process coverage metric values. In this case, instead of updating a single best path, N best paths are accumulated at any given time. Thus, each time the lower bound $q_b$ of the paths going through a current sub-path $\pi_{cur}$ is computed (e.g., step 222 of the method 200), the lower bound is compared with the process coverage metric value for the worst path $\pi_{worst}$ of the set of best paths found (e.g., step 224). If the lower bound $q_b$ is better than the inverse process coverage metric value for the worst path $\pi_{worst}$ traversal of the current sub-path $\pi_{cur}$ is continued (e.g., step 226); otherwise, unexplored paths are investigated (e.g., step 218).

In this case, each time the method 200 arrives at the start point of the current sub-path $\pi_{cur}$ the inverse process coverage metric for the entire path is compared to the inverse process coverage metric value for the worst path $\pi_{worst}$ (e.g., step 214). If the inverse process coverage metric for the current sub-path $\pi_{cur}$ is better than the inverse process coverage metric value for the worst path $\pi_{worst}$, the current sub-path $\pi_{cur}$ replaces the worst path $\pi_{worst}$ in the set of best paths found (e.g., step 216).

In a further embodiment still, the method 200 is modified to select the set of N paths $\pi_1, \pi_2 \ldots \pi_N$, such that, cumulatively, the set of N paths has the best process coverage metric. Thus, again, instead of updating a single best path, N best paths are accumulated at any given time. In this case, each time the current sub-path $\pi_{cur}$ is processed, the method 200 determines whether among the best paths found, there is a worst path $\pi_{worst}$ such that, if the worst path $\pi_{worst}$ is replaced with the current sub-path $\pi_{cur}$, the cumulative inverse process coverage metric is improved (e.g., step 224). If so, traversal is continued to extend the current sub-path $\pi_{cur}$ (e.g., step 226); otherwise, depth-first traversal is continued (e.g., step 218).

Moreover, each time the method 200 arrives at the start point of the current path $\pi_{cur}$, the method 200 determines whether among the best paths found, there is a worst path $\pi_{worst}$ such that, if the worst path $\pi_{worst}$ is replaced with the current sub-path $\pi_{cur}$, the cumulative inverse process coverage metric is improved (e.g., step 214). If so, the current path $\pi_{cur}$ replaces the worst path $\pi_{worst}$ in the set of N best paths.

Although the method 200 starts its traversals from end points and proceeds backward to start points, it is obvious that traversals can begin from start points and proceed forward in the timing graph using the same metrics and the same branch and bound criteria. The traversals can also start from any mid-point of the graph and proceed both forward and backward until end points and start points, respectively, are reached. Depending on the application, it may be advantageous to start traversals from end points, start points, or mid-points.

The method 200 and its modifications are useful not just for testing of IC chips, but also for reporting the statistically most critical paths and for variation-aware optimization of the chip design. The method 200 can also be modified to select a minimal set of paths with a user-specified value of the cumulative process coverage metric. The quality of the solutions produced by the method 200 can be improved by accumulating more paths and selecting the best paths from among the paths accumulated after rejecting some paths due to difficulties in sensitizing them, for example.

Although the present invention is described within the context of path selection for at-speed testing of IC chips, those skilled in the art will appreciate that the concepts of the present invention (in particular, the computation of a path-specific process coverage metric) can be applied in other fields as well, including, but not limited to, critical path reporting (i.e., reporting paths with the highest probabilities of being critical), common path pessimism reduction algorithms, chip binning (e.g., silicon to model correlation), and yield optimization. The present invention is described in the context of detecting late mode or setup violations (i.e., detecting long paths). Those of ordinary skill in the art will appreciate that the concepts of the present invention may be also applied to detect early mode or hold violations (i.e., to detect short paths).

Figure 4:
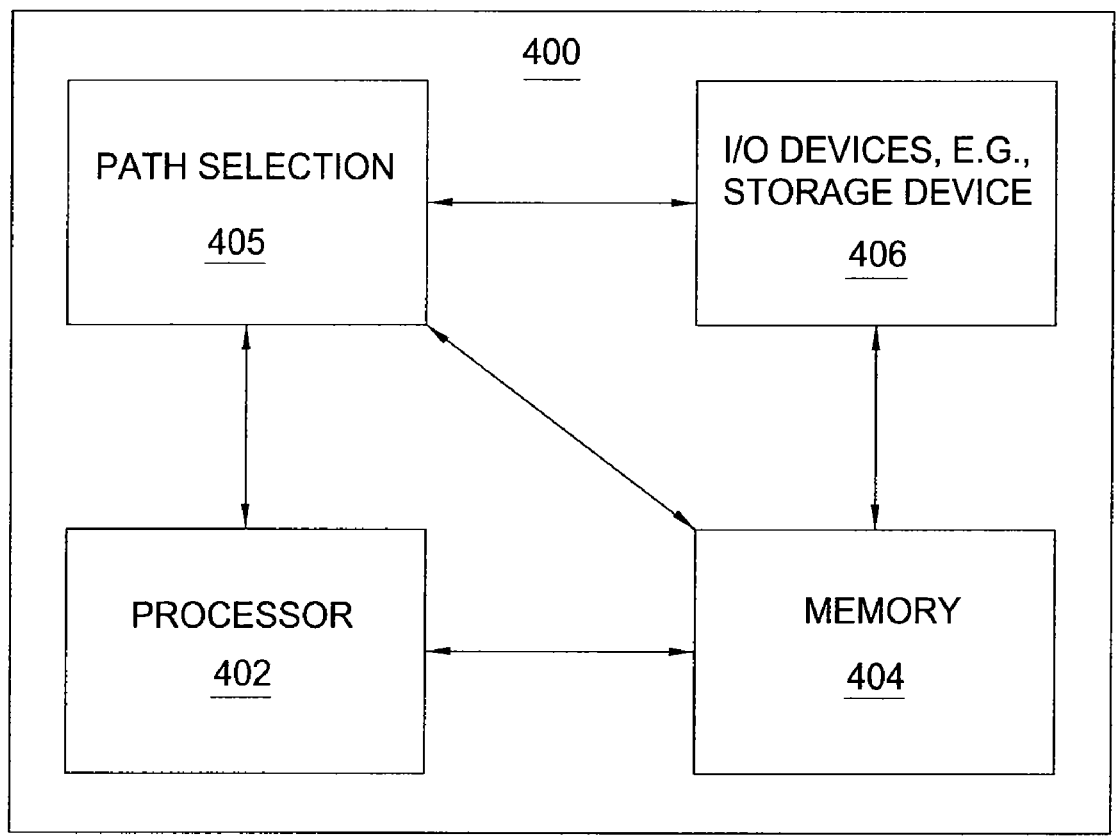
FIG. 4 is a high-level block diagram of the path selection method that is implemented using a general purpose computing device.

FIG. 4 is a high-level block diagram of the path selection method that is implemented using a general purpose computing device 400. In one embodiment, a general purpose computing device 400 comprises a processor 402, a memory 404, a path selection module 405 and various input/output (I/O) devices 406 such as a display, a keyboard, a mouse, a stylus, a wireless network access card, and the like. In one embodiment, at least one I/O device is a storage device (e.g., a disk drive, an optical disk drive, a floppy disk drive). It should be understood that the path selection module 405 can be implemented as a physical device or subsystem that is coupled to a processor through a communication channel.

Alternatively, the path selection module 405 can be represented by one or more software applications (or even a combination of software and hardware, e.g., using Application Specific Integrated Circuits (ASIC)), where the software is loaded from a storage medium (e.g., I/O devices 406) and operated by the processor 402 in the memory 404 of the general purpose computing device 400. Thus, in one embodiment, the path selection module 405 for selecting paths for at-speed testing of integrated circuit chips, as described herein with reference to the preceding Figures can be stored on a computer readable storage medium or carrier (e.g., RAM, magnetic or optical drive or diskette, and the like).

It should be noted that although not explicitly specified, one or more steps of the methods described herein may include a storing, displaying and/or outputting step as required for a particular application. In other words, any data, records, fields, and/or intermediate results discussed in the methods can be stored, displayed, and/or outputted to another device as required for a particular application. Furthermore, steps or blocks in the accompanying Figures that recite a determining operation or involve a decision, do not necessarily require that both branches of the determining operation be practiced. In other words, one of the branches of the determining operation can be deemed as an optional step.

While the foregoing is directed to embodiments of the present invention, other and further embodiments of the invention may be devised without departing from the basic scope thereof. Various embodiments presented herein, or portions thereof, may be combined to create further embodiments. Furthermore, terms such as top, side, bottom, front, back, and the like are relative or positional terms and are used with respect to the exemplary embodiments illustrated in the figures, and as such these terms may be interchangeable.

What is claimed is:

1. A method for selecting at least one path of an integrated circuit chip for at-speed testing, the method comprising:
   computing a cumulative process coverage metric for a plurality of paths in the integrated circuit chip, wherein a process coverage metric for a given path in the plurality of paths is a value that directly defines a probability that the integrated circuit chip will have no timing violations if the given path passes at-speed testing; and
   selecting, from among the plurality of paths, the at least one path that maximizes a value of the cumulative process coverage metric for the plurality of paths,
   wherein at least one of the computing and the selecting is performed using a processor.

2. The method of claim 1, wherein the process coverage metric for the given path is computed using results from statistical static timing of the integrated circuit chip.

3. The method of claim 1, wherein the selecting is performed in accordance with a branch and bound algorithm that traverses each of the plurality of paths in a backward manner from an end point to a start point.

4. The method of claim 1, wherein the computing comprises, for each of the plurality of paths;
   calculating, at each node in a given sub-path, the process coverage metric for each path that passes through the node along the sub-path;
   identifying a path passing through the node for which the process coverage metric is best;
   continuing traversal of the sub-path along the identified path to a next node, if the process coverage metric for the identified path is better than a process coverage metric of a currently identified best path; and
   investigating an alternate path, if the process coverage metric for the identified path is not better than a process coverage metric of the currently identified best path.

5. The method of claim 4, further comprising:
   iterating the calculating, identifying, continuing, and investigating until a start point is reached, at which point a complete path is obtained.

6. The method of claim 5, wherein the selecting comprises:
   comparing the process coverage metric for the complete path to the process coverage metric of the currently identified best path; and
   replacing the currently identified best path with the complete path, if the process coverage metric computed for the complete path is better than the process coverage metric computed for the currently identified best path.

7. The method of claim 4, wherein traversal of the sub-path begins at a start point of a timing graph and proceeds forward toward an end point of the timing graph.

8. The method of claim 4, wherein traversal of the sub-path begins at an end point of a timing graph and proceeds backward toward a start point of the timing graph.

9. The method of claim 4, wherein traversal of the sub-path begins at an interior node of a timing graph and proceeds either forward toward an end point of the timing graph or backward toward a start point of the timing graph.

10. The method of claim 1, wherein the computing comprises, for each of the plurality of paths:
    calculating, at each node in a given sub-path, the process coverage metric for each path that passes through the node along the sub-path;
    identifying a path passing through the node for which the process coverage metric is best; and
    continuing traversal of the sub-path along the identified path to a next node, if the process coverage metric for the identified path is better than a process coverage metric of a worst path in a set of best paths.

11. The method of claim 10, further comprising:
    iterating the calculating, identifying, continuing, and investigating until a start point is reached, at which point a complete path is obtained.

12. The method of claim 11, wherein the selecting comprises:
    comparing the process coverage metric for the complete path to the process coverage metric of the worst path; and
    replacing the worst path with the complete path, if the process coverage metric computed for the complete path is better than the process coverage metric computed for the worst path.

13. The method of claim 1, wherein the computing comprises, for each of the plurality of paths;
    calculating, at each node in a given sub-path, the process coverage metric for each path that passes through the node along the sub-path;
    identifying a path passing through the node for which the process coverage metric is best; and
    continuing traversal of the sub-path along the identified path to a next node, if replacement of a worst path in a set of best paths with the identified path will result in a better cumulative process coverage metric for the set of paths.

14. The method of claim 13, further comprising:
iterating the calculating, identifying, continuing, and investigating until a start point is reached, at which point a complete path is obtained.

15. The method of claim 14, wherein the selecting comprises:
comparing the process coverage metric for the complete path to the process coverage metric of the worst path; and
replacing the worst path with the complete path, if the replacement will result in a better cumulative process coverage metric for the set of paths.

16. The method of claim 1, wherein the method is applied in the field of critical path reporting.

17. The method of claim 1, wherein the method is applied in the field of a common path pessimism reduction.

18. The method of claim 1, wherein the method is applied in the field of chip binning.

19. The method of claim 1, wherein the method is applied in the field of yield optimization.

20. The method of claim 1, wherein the at least one path is selected to detect late mode setup violations.

21. The method of claim 1, wherein the at least one path is selected to detect early mode hold violations.

22. A computer readable storage device containing a program for selecting at least one path of an integrated circuit chip for at-speed testing, where the program is executable by a computer and performs steps of:
computing a cumulative process coverage metric for a plurality of paths in the integrated circuit chip, wherein a process coverage metric for a given path in the plurality of paths is a value that directly defines a probability that the integrated circuit chip will have no timing violations if the given path passes at-speed testing; and
selecting, from among the plurality of paths, the at least one path that maximizes a value of the cumulative process coverage metric for the plurality of paths.

23. The computer readable device of claim 22, wherein the computing comprises, for each of the plurality of paths;
calculating, at each node in a given sub-path, the process coverage metric for each path that passes through the node along the sub-path;
identifying a path passing through the node for which the process coverage metric is best;
continuing traversal of the sub-path along the identified path to a next node, if the process coverage metric for the identified path is better than a process coverage metric of a currently identified best path; and
investigating an alternate path, if the process coverage metric for the identified path is not better than a process coverage metric of the currently identified best path.

24. Apparatus for computing a metric for selecting at least one path of an integrated circuit chip for at-speed testing, the apparatus comprising:
means for computing a cumulative process coverage metric for a plurality of paths in the integrated circuit chip, wherein a process coverage metric for a given path in the plurality of paths is a value that directly defines a probability that the integrated circuit chip will have no timing violations if the given path passes at-speed testing; and
means for selecting, from among the plurality of paths, the at least one path that maximizes a value of the cumulative process coverage metric for the plurality of paths.

25. The method of claim 1, wherein the value of the cumulative process coverage metric increases as a number of paths in the plurality of paths increases.

* * * * *